(12) United States Patent
Liu et al.

(10) Patent No.: US 7,388,753 B2
(45) Date of Patent: Jun. 17, 2008

(54) METHODS AND APPARATUSES FOR THERMAL DISSIPATION

(75) Inventors: Ping Liu, South Surrey (CA); Min Li, Vancouver (CA)

(73) Assignee: Sierra Wireless, Inc., Richmond, BC (CA)

( * ) Notice: Subject to any disclaimer, the term of this patent is extended or adjusted under 35 U.S.C. 154(b) by 55 days.

(21) Appl. No.: 11/403,562

(22) Filed: Apr. 12, 2006

(65) Prior Publication Data

US 2006/0256529 A1    Nov. 16, 2006

Related U.S. Application Data

(60) Provisional application No. 60/671,307, filed on Apr. 13, 2005.

(51) Int. Cl.
*H05K 7/20* (2006.01)
*H01L 23/36* (2006.01)

(52) U.S. Cl. .............. 361/720; 361/704; 361/715; 361/722; 174/16.3; 174/252; 165/80.3; 165/104.33; 165/185

(58) Field of Classification Search ........ 361/700–712, 361/714–722, 735, 744, 761, 763–765, 782–785, 361/790–792; 174/15.2, 16.3, 52.1, 252; 257/686, 706–712; 165/80.3, 80.4, 104.33, 165/104.21, 104.23, 185
See application file for complete search history.

(56) References Cited

U.S. PATENT DOCUMENTS

| 4,369,485 | A | * | 1/1983 | Bell et al. .................... 361/722 |
| 5,249,741 | A | | 10/1993 | Bistline et al. |
| 5,353,192 | A | * | 10/1994 | Nordin ....................... 361/700 |
| 5,808,869 | A | * | 9/1998 | Donahoe et al. ............ 361/704 |
| 5,862,037 | A | | 1/1999 | Behl |
| 5,920,037 | A | * | 7/1999 | Jimarez et al. ............. 174/259 |
| 6,104,620 | A | | 8/2000 | Dudas et al. |
| 6,111,751 | A | * | 8/2000 | Sakuyama .................. 361/704 |

OTHER PUBLICATIONS

International Search Report, , PCT/CA2006/000562, dated Aug. 1, 2006.

* cited by examiner

*Primary Examiner*—Michael V Datskovskiy
(74) *Attorney, Agent, or Firm*—Thelen Reid Brown Raysman & Steiner LLP

(57) ABSTRACT

A method and apparatus for providing thermal dissipation from a PC card is disclosed. For one embodiment of the invention, an extension portion, having a heat sink implemented thereon, is provided for a PC card. The extension portion extends beyond the PC card slot allowing thermal dissipation from the card due to air flow over the heat sink. For one embodiment of the invention, heat producing components of the PC card are identified and a thermally conductive path is provided from the components to the extension portion of the PC card.

14 Claims, 2 Drawing Sheets

METHODS AND APPARATUSES FOR THERMAL DISSIPATION

CROSS-REFERENCE TO RELATED APPLICATION

This application is a non-provisional application claiming priority to provisional application Ser. No. 60/671,307, filed on Apr. 13, 2005, entitled "Mechanism for PC Removable Module and Card Thermal Dissipation," which is herein incorporated by reference in its entirety.

FIELD

Embodiments of the invention relate generally to the field of personal computing devices (PCs, PDAs, etc.) and more specifically to PC add-on cards (PC cards) and methods and apparatuses to provide thermal dissipation for PC cards.

BACKGROUND

PC cards such as PCMCIA, 16-bit PC Card, Cradbus Card, ExpressCard, Compact Flash card and other PC/PDA add-on cards are manufactured in a variety of sizes and used as expansion boards for PCs, PDAs etc. The PC cards generate heat that has to be dissipated to avoid damage to the PC components or interruption of the application. Typically, such PC cards have a thermal dissipation capacity of about 1~3 Watts (W). This thermal dissipation capacity is adequate for many applications for which the PC card is used. For example, a 2 W thermal dissipation capacity on a wireless PC card is satisfactory for surfing the web or transmission of e-mail, or other files of limited size. However, some applications may result in exceeding the thermal dissipation capacity of the PC card. For example, continued data transmission at high rates with maximum RF radiated power can exceed the thermal dissipation capacity of the PC card.

Additionally, the processing power requirements, and hence the heat generation, for wide area broadband wireless devices is increasing. For example, 3 G (an ITU specification for third generation wireless technology) may provide bandwidth of 2 Mbps or more. Since PCMCIA and other PC add-on card standards were not specifically defined for such applications, thermal dissipation is problematic when designing wireless modems for the mobile host devices, especially for smaller form factor PC cards such as ExpressCard/34.

Advances in semiconductor technology have lowered the power consumption per MIPS, but not enough to keep heat generation within acceptable levels, nor has the efficiency of transmitters used on wireless devices improved significantly. For example, according to the current PCMCIA PC Card standard, when a PC Card generates 3 W (i.e., thermal dissipation capacity) at the maximum host slot temperature of +65 C, the external card temperature will reach +90 C. In this case the card internal temperature would exceed +90 C. A typical class 12 GPRS (50% time burst transmit) wireless PC card with 5 W average DC power draw at 31.8 dBm RF power radiated would exceed +85 C internal temperature at only +60 C host slot temperature.

Compact Flash card technology shares the same interface standard as the 16-bit PC card, but with smaller size. When a typical class 10 GPRS wireless Compact Flash card is used in a PDA Compact Flash slot, similar thermal dissipation problems are observed.

Moreover, the size of next generation of PC cards (e.g., ExpressCard) is decreasing with the size of the mobile computing devices (e.g., laptop PCs, PDAs, etc.) in which they are used. The thermal dissipation capacity of the host slot on such devices is reduced accordingly and the thermal dissipation capacity of the card is reduced. For example, the ExpressCard has a thermal dissipation capacity of only 2.1 W.

Currently, excessive heat (exceeding the thermal dissipation capacity) is addressed through thermal management mechanisms. For example, the temperature of the card is monitored and if the temperature exceeds a specified threshold, the transmission power and/or transmission rate is reduced. Such thermal management mechanisms are disadvantageous in that they result in performance degradation on data throughput or radio cover range in balanced or upload oriented broadband wireless applications, such as FTP upload, video conference, wireless video surveillance, wireless digital camera, etc.

SUMMARY

In accordance with one embodiment of the invention a personal computer card includes a slot portion configured for insertion into a host slot of a device. An extension portion, which is configured to extend beyond the host slot of the device, extends from the slot portion. The extension portion has a heat sink thermally coupled thereto.

Other features and advantages of embodiments of the present invention will be apparent from the accompanying drawings, and from the detailed description, that follows below.

DESCRIPTION OF THE DRAWINGS

The invention may be best understood by referring to the following description and accompanying drawings that are used to illustrate embodiments of the invention. In the drawings.

DETAILED DESCRIPTION

A method and apparatus for providing thermal dissipation from a PC card is disclosed. For one embodiment of the invention, an extension portion, having a heat sink implemented thereon, is provided for a PC card. The extension portion extends beyond the PC card slot allowing thermal dissipation from the card due to air flow over the heat sink. For one embodiment of the invention, heat producing components of the PC card are identified and a thermally conductive path is provided from the components to the extension portion of the PC card.

In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all features of a single disclosed embodiment. Thus, the claims following the Detailed Description are hereby expressly incorporated into this Detailed Description, with each claim standing on its own as a separate embodiment of this invention.

Figure 1:
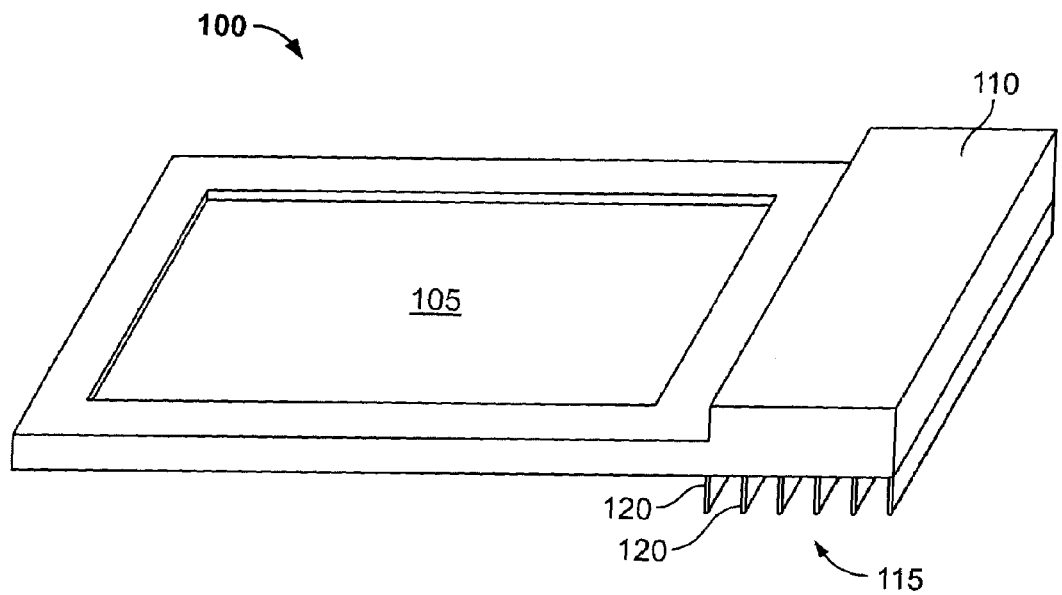
FIG. 1 illustrates a PC card in accordance with one embodiment of the invention.

FIG. 1 illustrates a PC card in accordance with one embodiment of the invention. PC card 100, shown in FIG. 1, includes a PC card slot portion 105, which is configured for insertion into a host slot of a device (e.g., a laptop PC). PC card 100 also includes a PC card extension portion 110. The extension portion 110 is configured to extend beyond the host slot of the device. Thermally coupled to the extension portion 110 is a heat sink 115. The heat sink 15 may be made of a suitable material for thermal dissipation. For example, the heat sink 115 may be made of a material having a relatively high thermal conductivity. That is, the heat sink 115 may be made of a material having a thermal conductivity greater than approximately 5 W/m K. For example, copper (Cu) has a thermal conductivity of approximately 385 W/m K and aluminum (Al) has a thermal conductivity of approximately 205 W/m K. Both Cu and Al have relatively high thermal conductivity in comparison to materials such as plastic that are generally used to fabricate the extension portion.

For one embodiment of the invention, the heat sink may include various designs to increase the surface area of the heat sink. For example, as shown in FIG. 1, heat sink 115 includes a number of fins 120 formed thereon. The fins 120 increase the surface area of the heat sink 115 and thereby provide greater thermal dissipation. For example, a 6 fin aluminum heat sink (0.5×4 cm² per side of fin) can dissipate 2 W heat with 20 C above ambient temperature in a natural airflow environment. That is, such a heat sink can remove 2 W heat with the heat sink temperature raised just front +40 C to +60 C.

For one embodiment of the invention, the heat sink is implemented on the extension portion in a way that will not interfere with the intended operation of the PC card. For example, many PC cards are designed with extension portions in order to facilitate components that have to remain out side the host slot. For example, many PC cards for wireless application require an antenna that must be outside the host slot. Therefore, the antenna is implemented in an extension portion. In such embodiments, the placement of the heat sink on the extension portion may be restricted due to the functionality of the extension portion. For example, for some wireless devices, an antenna is implemented within an extension portion, as the antenna must remain outside the host slot. For such an embodiment, the heat sink may be coupled to a bottom side of the extension portion in order to avoid interfering with the operation of the antenna. That is, the metal (e.g., Cu) of the heat sink may interfere with the operation of the antenna. In such an embodiment, the top portion of the extension portion may remain clear to facilitate use of the antenna.

For one embodiment of the invention, an extension portion is implemented solely to serve as a heat sink. For such an embodiment, the entire extension portion may be a heat sink. Alternatively, for such an embodiment, the heat sink may be coupled to any portion of the extension portion.

Embodiments of the invention may contain additional thermal dissipation mechanisms. For example, for one embodiment a solid ground is implemented between one or more high heat producing components (e.g., a power amplifier) of the device and the heat sink.

For example, as shown in FIG. 1, heat sink 115 includes a number of fins 120 formed thereon. The fins 120 increase the surface area of the heat sink 115 and thereby provide greater thermal dissipation. For example, a 6 fin aluminum heat sink (0.5×4 cm² per side of fin) can dissipate 2 W heat with 20 C above ambient temperature in a natural airflow environment. That is, such a heat sink can remove 2 W heat with the heat sink temperature raised just front +40 C to +60 C.

For one embodiment of the invention, the heat sink is implemented on the extension portion in a way that will not interfere with the intended operation of the PC card. For example, many PC cards are designed with extension portions in order to facilitate components that have to remain out side the host slot. For example, many PC cards for wireless application require an antenna that must be outside the host slot. Therefore, the antenna is implemented in an extension portion. In such embodiments, the placement of the heat sink on the extension portion may be restricted due to the functionality of the extension portion. For example, for some wireless devices, an antenna is implemented within an extension portion, as the antenna must remain outside the host slot. For such an embodiment, the heat sink may be coupled to a bottom side of the extension portion in order to avoid interfering with the operation of the antenna. That is, the metal (e.g., Cu) of the heat sink may interfere with the operation of the antenna. In such an embodiment, the top portion of the extension portion may remain clear to facilitate use of the antenna For one embodiment of the invention, an extension portion is implemented solely to serve as a heat sink. For such an embodiment, the entire extension portion may be a heat sink. Alternatively, for such an embodiment, the heat sink may be coupled to any portion of the extension portion.

Embodiments of the invention may contain additional thermal dissipation mechanisms. For example, for one embodiment a solid ground is implemented between one or more high heat producing components (e.g., a power amplifier) of the device and the heat sink.

Figure 2:
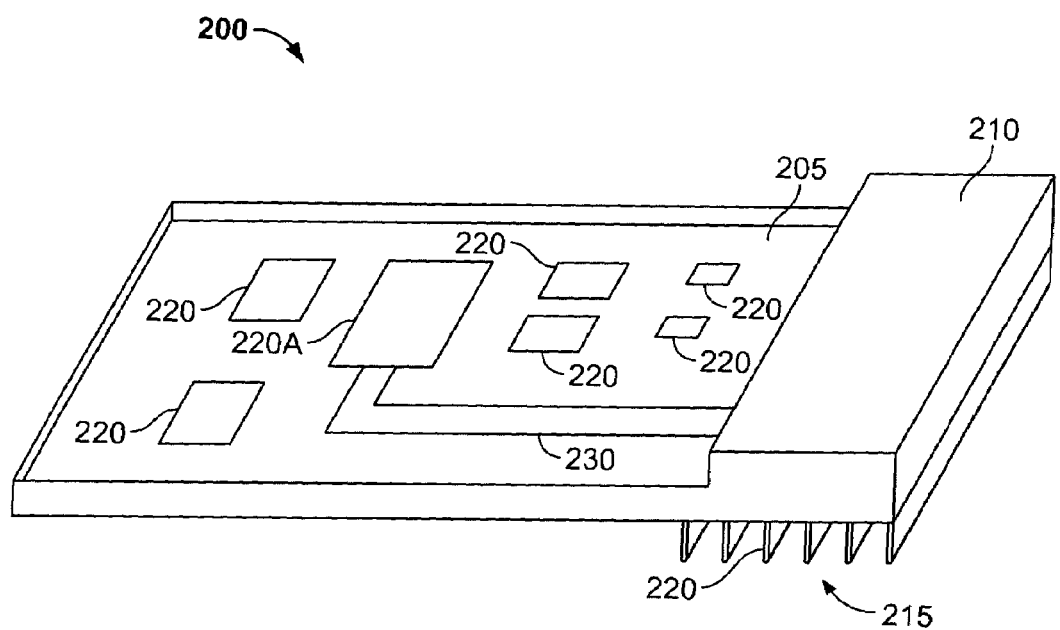
FIG. 2 illustrates a PC card in which a conductive path is implemented between one or more heat producing components and the heat sink in accordance with one embodiment of the invention.

FIG. 2 illustrates a PC card in which a conductive path is implemented between one or more heat producing components and the heat sink in accordance with one embodiment of the invention.

PC card 200, shown in FIG. 2, includes a PC card slot portion 205 and a PC card extension portion 210 extending therefrom. PC card slot portion 205 is cutaway to reveal a number of components 220. Component 220A, which may be, for example, a power amplifier, is determined to be a high heat producing component. That is, component 220A generates more heat than the other components 220.

As shown in FIG. 2, a thermally conductive path 230 is implemented between component 220A and the extension portion 210 and the heat sink 215. Heat sink 215 has fins 220 attached thereto. For one embodiment of the invention, the thermally conductive path may be implemented as a solid ground (e.g., Cu ground) heat transfer pipe. In alternative embodiments of the invention, the thermally conductive path 230 may be implemented as a thermal gaske to transfer heat to the PC card metal enclosure that has a good thermal couple to the heat sink 215.

Various factors including functionality and form are considered before implementing a heat sink on a PC card.

Figure 3:
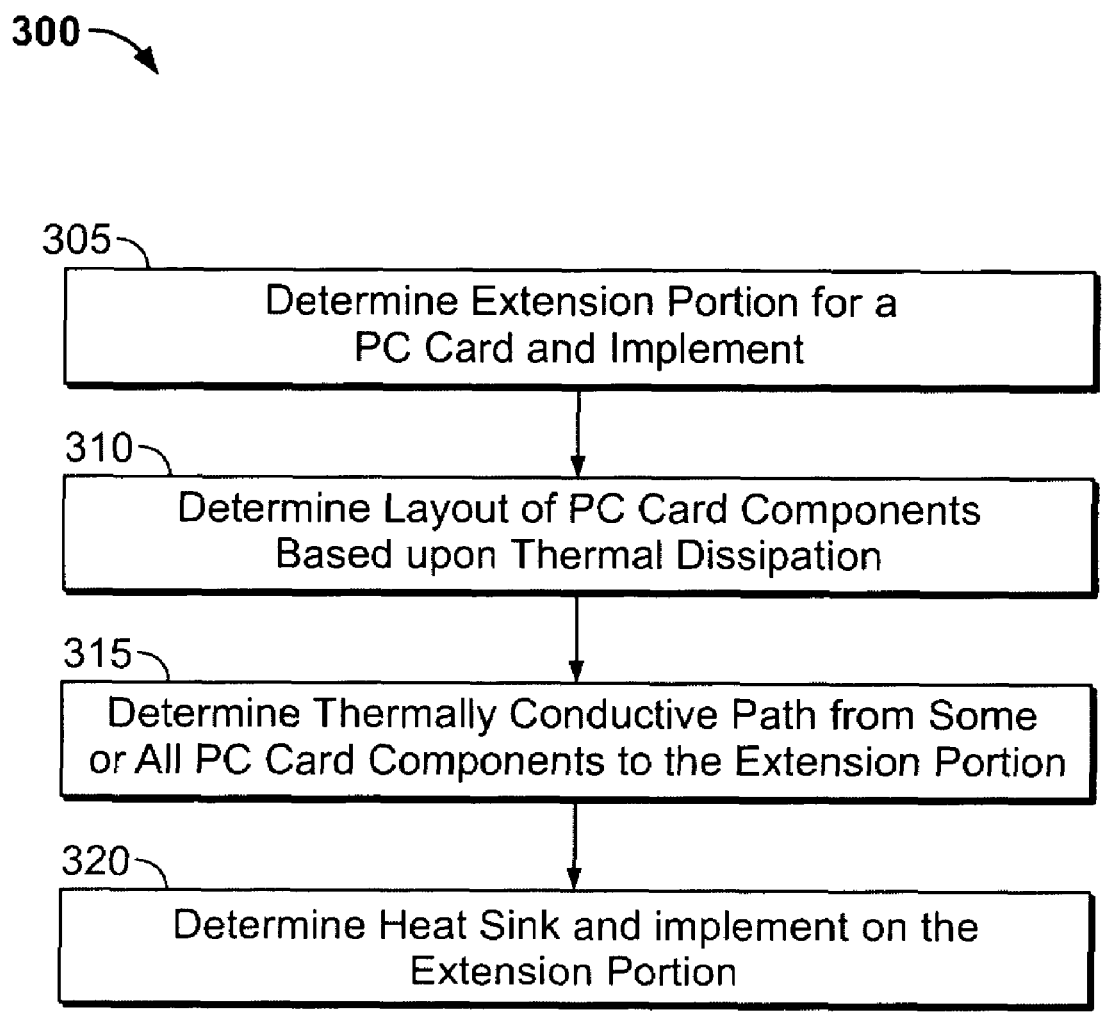
FIG. 3 illustrates a process for producing a PC card providing increased thermal dissipation.

FIG. 3 illustrates a process for producing a PC card providing increased thermal dissipation. Process 300, shown in FIG. 3 begins with step 305 in which an extension portion for the PC card is determined and implemented. The extension portion may be determined based upon a known thermal dissipation requirement, or based upon a determined thermal dissipation requirement as discussed below. The determination may be in regard to any number of different characteristics of the extension portion including the size, shape, or position of the extension portion as well as to the material of which the extension portion is made. For one embodiment, the extension portion provides required functionality (e.g., an antenna) and is therefore designed in accordance with such functionality. For alternative embodiments of the invention, the extension portion may be designed for use solely as a thermal dissipation mechanism. For such embodiments, the extension portion may be of various forms and may be made, in-part or in-whole, of suitable materials (e.g., materials exhibiting relatively high thermal conductivity).

At operation 310 the PC card components layout is determined with consideration given to thermal dissipation requirements. For example, PC card components determined to generate a relatively large portion of the heat are implemented as close to the extension portion as possible or are placed on the extension portion of the card. Alternatively, or additionally, at operation 315, a thermally conductive path is determined and provided from some or all of such components to the extension portion. That is, heat is conducted from inside the PC card to the extension portion (i.e., outside the host slot). The implementation of such a thermally conductive path may be based upon the thermal dissipation requirements.

At operation 320, a heat sink is implemented on the extension portion. For one embodiment of the invention for which the extension portion provides no other functionality than thermal dissipation, the entire extension portion is implemented as a heat sink. For one such embodiment, fins or other designs, are implemented on the heat sink to the surface area of the heat sink and thus, the air flow over the heat sink, thereby increasing thermal dissipation. The dimensions and position of the heat sink may be based upon the thermal dissipation requirements as well as functionality provided by the extension portion, if any.

For embodiments of the invention in which the extension portion is used to provide particular functionality (e.g., an antenna implemented on the extension portion), the heat sink is implemented on the extension portion in a manner that does not interfere with the functionality provided. For example, where the extension portion is used to implement a patch antenna, the heat sink can be implemented on the underside of the extension portion so as not to interfere with the operation of the antenna.

One embodiment of the invention includes determining the required thermal dissipation and how such thermal dissipation will be attained. This may be accomplished by determining the heat generated by a PC card at highest performance and subtracting the thermal dissipation provided by the device. For example, if it is determined that at highest performance the PC card generates 2.5 W, and it is known that the capability of the device is to dissipate 2.1 W (i.e., as is typical for an ExpressCard), then a thermal dissipation mechanism that dissipates the difference (0.4 W) may be designed in accordance with an embodiment of the invention. For one embodiment of the invention, the thermal dissipation capability of the heat sink may be much greater than the determined thermal dissipation thus making the PC card more "thermal friendly" to the PC/PDA host or allowing the PC card to run cooler.

In order to attain the determined thermal dissipation, such factors as the size, shape, and surface area of the extension portion, the position of the major heat producing components of the PC card, the layout of a thermally conductive path from the heat producing components, and the functionality provided by the antenna portion are considered.

GENERAL MATTERS

Embodiments of the invention provide a PC card having an extension portion with a heat sink implemented thereon. For one embodiment of the invention the heat sink allows more heat to be dissipated from the card via natural airflow without sacrificing the performance of the PC card (e.g., broadband wireless add-on cards/modules). Embodiments of the invention include PC cards having extension portions made of Cu, Al, or other suitable materials having relatively high thermal conductivity (i.e., relatively high compared with typical materials (e.g., plastic) used to fabricate PC card extension portions). For some embodiments of the invention, the heat sink is implemented on the extension portion so as not to interfere with any functionality of the PC card or device.

Embodiments of the invention have been described as including various operations. Many of the processes are described in their most basic form, but operations can be added to or deleted from any of the processes without departing from the scope of the invention. For example, FIG. 3 illustrates a process for producing a PC card providing increased thermal dissipation. Prior to operation 305 discussed in reference to FIG. 3, the operation of determining the amount of heat to be dissipated may be performed.

Some of the operations of the invention may be performed by hardware components or may be embodied in machine-executable instructions, which may be used to cause a general-purpose or special-purpose processor or logic circuits programmed with the instructions to perform the operations. Alternatively, the operations may be performed by a combination of hardware and software. The invention may be provided as a computer program product that may include a machine-readable medium having stored thereon instructions, which may be used to program a computer (or other electronic devices) to perform a process according to the invention. The machine-readable medium may include, but is not limited to, floppy diskettes, optical disks, CD-ROMs, and magneto-optical disks, ROMs, RAMs, EPROMs, EEPROMs, magnet or optical cards, flash memory, or other type of media/machine-readable medium suitable for storing electronic instructions. Moreover, the invention may also be downloaded as a computer program product, wherein the program may be transferred from a remote computer to a requesting computer by way of data signals embodied in a carrier wave or other propagation medium via a communication cell (e.g., a modem or network connection). All operations may be performed at the same central cite or, alternatively, one or more operations may be performed elsewhere.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A personal computer card comprising:
    a slot portion configured for insertion into a host slot of a device;
    an extension portion, extending from the slot portion, configured to extend beyond the host slot of the device;
    a heat sink thermally coupled to the extension portion;
    a thermally conductive path connecting one or more components disposed in the slot portion of the personal computer card to the extension portion of the personal computer card,
    wherein the thermally conductive path comprises a thermal gasket.

2. The personal computer card of claim 1 wherein the heat sink comprises a material having a thermal conductivity greater than 5 W/m K.

3. The personal computer card of claim 1 wherein the heat sink has one or more fins formed thereon.

4. The personal computer card of claim 1 wherein the thermally conductive path comprises a ground plane.

5. The personal computer card of claim 1 wherein the heat sink comprises a material having a thermal conductivity greater than 5 W/m K.

6. The personal computer card of claim 1 wherein the extension portion implements a functionality and the heat sink does not interfere with the functionality.

7. A personal computer card comprising:
    a slot portion configured for insertion into a host slot of a device;
    an extension portion, extending from the slot portion, configured to extend beyond the host slot of the device; and
    a heat sink thermally coupled to the extension portion,
    wherein the extension portion implements a functionality and the heat sink does not interfere with the functionality, and wherein the functionality comprises an antenna.

8. A method comprising:
    determining a thermal dissipation requirement of a personal computer card, the personal computer card having a slot portion configured for insertion into a host slot of a device and an extension portion, extending from the slot portion, configured to extend beyond the host slot of the device;
    determining one or more characteristics of the extension portion of the personal computer card based upon the determined thermal dissipation requirement; and
    implementing a thermally conductive path connecting one or more components of the personal computer card to a heat sink formed on the extension portion of the personal computer card,
    wherein the thermally conductive path comprises a thermal gasket configured to transfer heat to at least one of a heat sink and an enclosure of the personal computer card.

9. The method of claim 8 further comprising:
    implementing a heat sink on the extension portion of the personal computer card.

10. The method of claim 9 wherein the heat sink comprises a material having a thermal conductivity greater than 5 W/m K.

11. The method of claim 10 wherein the heat sink has one or more structure formed thereon to increase the surface area of the heat sink.

12. The method of claim 8 wherein the thermally conductive path comprises a ground plane.

13. The method of claim 8 wherein the heat sink comprises a material having a thermal conductivity greater than 5 W/m K.

14. The method of claim 9 wherein the extension portion implements a functionality and the heat sink does not interfere with the functionality.

* * * * *